United States Patent
Gorin

(10) Patent No.: US 6,335,615 B1
(45) Date of Patent: Jan. 1, 2002

(54) MODE SELECTION METHODS FOR SIGNAL ANALYZERS HAVING ALTERNATIVE SWEPT AND FAST FOURIER TRANSFORM MODES OF OPERATION

(75) Inventor: Joseph M Gorin, Santa Rosa, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/534,188

(22) Filed: Mar. 24, 2000

(51) Int. Cl.$^7$ .................. G01R 23/02; G01R 23/00; G01R 23/16; H03M 1/62
(52) U.S. Cl. ..................... 324/76.39; 324/76.19; 324/76.21; 324/76.22; 324/76.27; 341/139; 341/155
(58) Field of Search .............. 324/76.19, 76.21, 324/76.22, 76.27, 76.39; 341/139, 155

(56) References Cited

U.S. PATENT DOCUMENTS

| | | | | |
|---|---|---|---|---|
| 4,408,284 A | * | 10/1983 | Kijesky et al. ............ 702/77 |
| 4,612,545 A | * | 9/1986 | Asendorf et al. ........... 342/16 |
| 4,672,380 A | * | 6/1987 | Bryant et al. ............. 342/92 |
| 4,903,024 A | * | 2/1990 | Evans et al. ............. 341/120 |
| 5,323,103 A | * | 6/1994 | Choate et al. ........... 324/76.22 |
| 5,499,391 A | * | 3/1996 | Tsui ..................... 455/226.2 |
| 5,508,605 A | * | 4/1996 | Lo et al. ............... 324/76.42 |
| 5,545,976 A | * | 8/1996 | Culter ................. 324/76.38 |
| 6,031,869 A | * | 10/1997 | Priebe et al. ............ 375/224 |
| 5,696,691 A | * | 12/1997 | Schlosser et al. ........... 702/77 |
| 5,706,202 A | * | 1/1998 | Itahara et al. ............. 702/77 |
| 5,884,512 A | * | 12/1998 | Gorin et al. ............. 341/139 |
| 5,995,914 A | * | 11/1999 | Cabot .................. 702/109 |

\* cited by examiner

*Primary Examiner*—Glenn W. Brown
*Assistant Examiner*—Wasseem H. Hamdan
(74) *Attorney, Agent, or Firm*—John L. Imperato

(57) ABSTRACT

A mode selection method for signal analyzers having alternative swept and Fast Fourier Transform (FFT) modes of operation enables tradeoffs between measurement speed and dynamic range to be optimized in selecting between the alternative operating modes. The method includes setting the signal analyzer to either a manual state or an automatic state according to a first input to a user interface. When the manual state is set, the analyzer is operated in either the swept operating mode or the FFT operating mode according to a second input to the user interface. When the automatic measurement state is set, a third input to the user interface determines whether measurement speed or dynamic range is optimized. Measurement speed is optimized according to a first optimization scheme and dynamic range is optimized according to a second optimization scheme.

10 Claims, 4 Drawing Sheets

MODE SELECTION METHODS FOR SIGNAL ANALYZERS HAVING ALTERNATIVE SWEPT AND FAST FOURIER TRANSFORM MODES OF OPERATION

BACKGROUND OF THE INVENTION

Measurement speed is a performance parameter of modern signal analyzers that influences measurement throughput when the analyzers are used in manufacturing facilities and other testing environments. Some modern signal analyzers have two alternative modes of operation—a swept mode and a Fast Fourier Transform (FFT) mode. Measurement speed in these analyzers depends on which of the operating modes is used to perform measurements and on other measurement settings, such as measurement frequency span and resolution bandwidth.

Dynamic range, another performance parameter of signal analyzers, determines the accuracy of the measurements performed by the analyzers and is also influenced by the operating mode that is used to perform the measurements. Higher dynamic range generally corresponds to higher measurement accuracy. While signal analyzers having dynamic range enhancing circuitry, such as that taught in U.S. Pat. No. 5,844,512, generally have higher dynamic range in the swept operating mode than in the FFT operating mode, the dynamic range also depends on other measurement settings of the analyzer.

Since dynamic range and measurement speed are both influenced by the operating mode of a signal analyzer, there is a need for a method of selecting between these alternative operating modes that enables tradeoffs between measurement speed and dynamic range to be optimized.

SUMMARY OF THE INVENTION

A mode selection method for signal analyzers having alternative swept and Fast Fourier Transform (FFT) modes of operation is constructed according to the preferred embodiment of the present invention. The method enables tradeoffs between measurement speed and dynamic range to be optimized in selecting between the swept operating mode and a FFT operating mode in response to inputs to a user interface associated with the signal analyzer. The method includes setting the signal analyzer to either a manual state or an automatic state according to a first input to the user interface. When the manual state is set, the analyzer is operated in either the swept operating mode or the FFT operating mode according to a second input to the user interface. When the automatic measurement state is set, a third input to the user interface determines whether measurement speed or dynamic range is optimized. Measurement speed is optimized according to a first optimization scheme and dynamic range is optimized according to a second optimization scheme.

DETAILED DESCRIPTION OF THE PREFERRED EMBODIMENT

Figure 1:
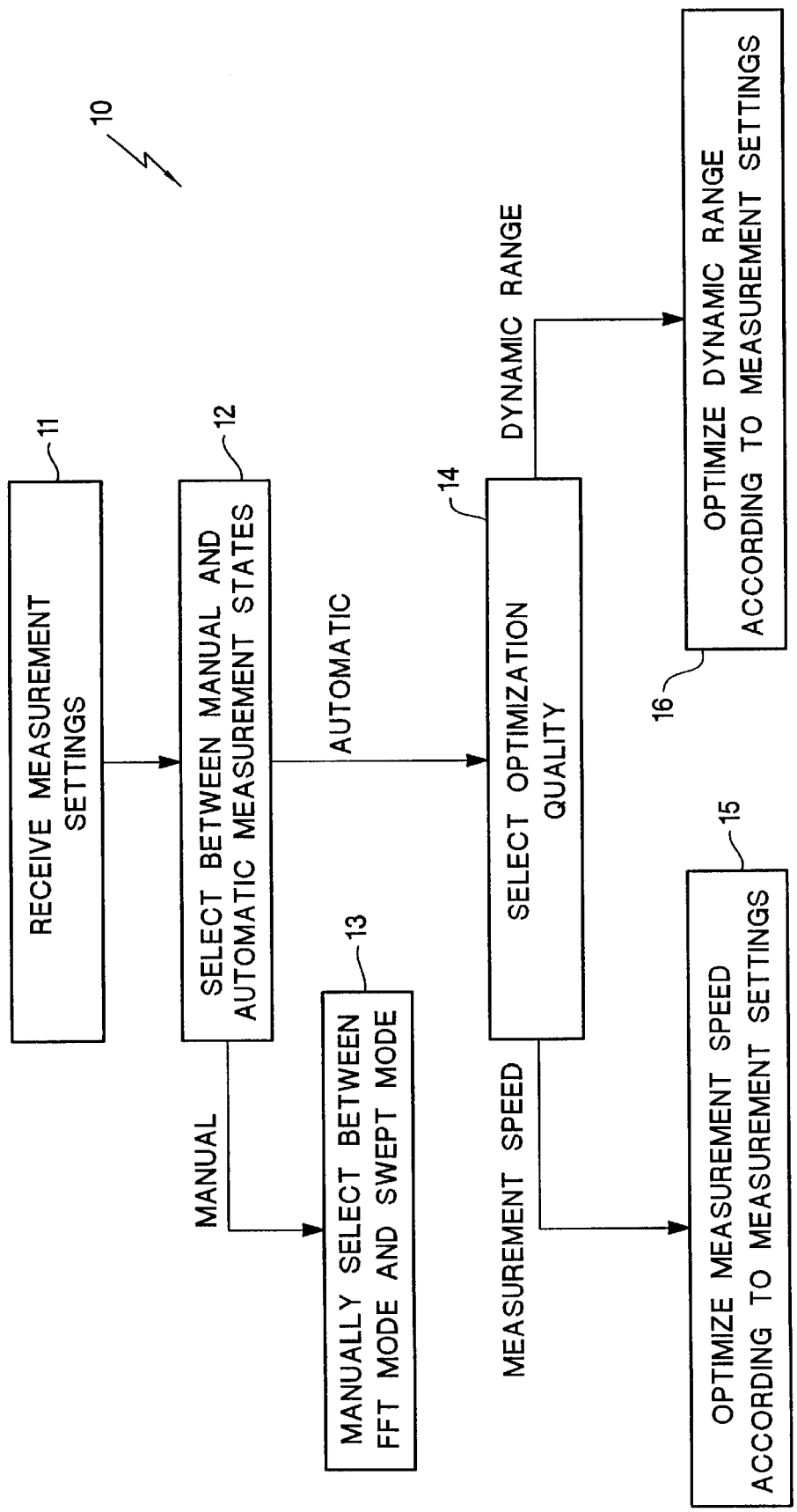
FIG. 1 is a flow diagram of the mode selection method constructed according to the preferred embodiment of the present invention.

FIG. 1 is a flow diagram of the mode selection method 10 constructed according to the preferred embodiment of the present invention. The method 10 is suitable for use with signal analyzers, such as hybrid spectrum analyzers, having alternative swept and Fast Fourier Transform (FFT) modes of operation. Typically, the mode selection method 10 is implemented in firmware or embedded software within the signal analyzer. Alternatively, the method 10 is included in an external computer or controller coupled to the signal analyzer.

In step 11 of the method 10, measurement settings, such as measurement frequency span (SPAN) and resolution bandwidth (RBW), are received. In step 12, the measurement state of the signal analyzer is selected via a user interface 35 (shown in FIG. 3). This selection establishes whether the measurement state is a manual state or an automatic state. Under the condition that the manual state is selected in step 12, manual selection between the FFT operating mode and the swept operating mode is enabled in step 13. Under the condition that the automatic state is selected in step 12, the user interface 35 enables selection between measurement speed optimization and dynamic range optimization in step 14. Based on the selection in step 14 and based on the received measurement settings in step 11, the method 10 automatically selects between the FFT operating mode and the swept operating mode in steps 15–16. Measurement speed is optimized according to a first optimization scheme in step 15 and dynamic range is optimized according to a second optimization scheme in step 16.

Figure 2A:
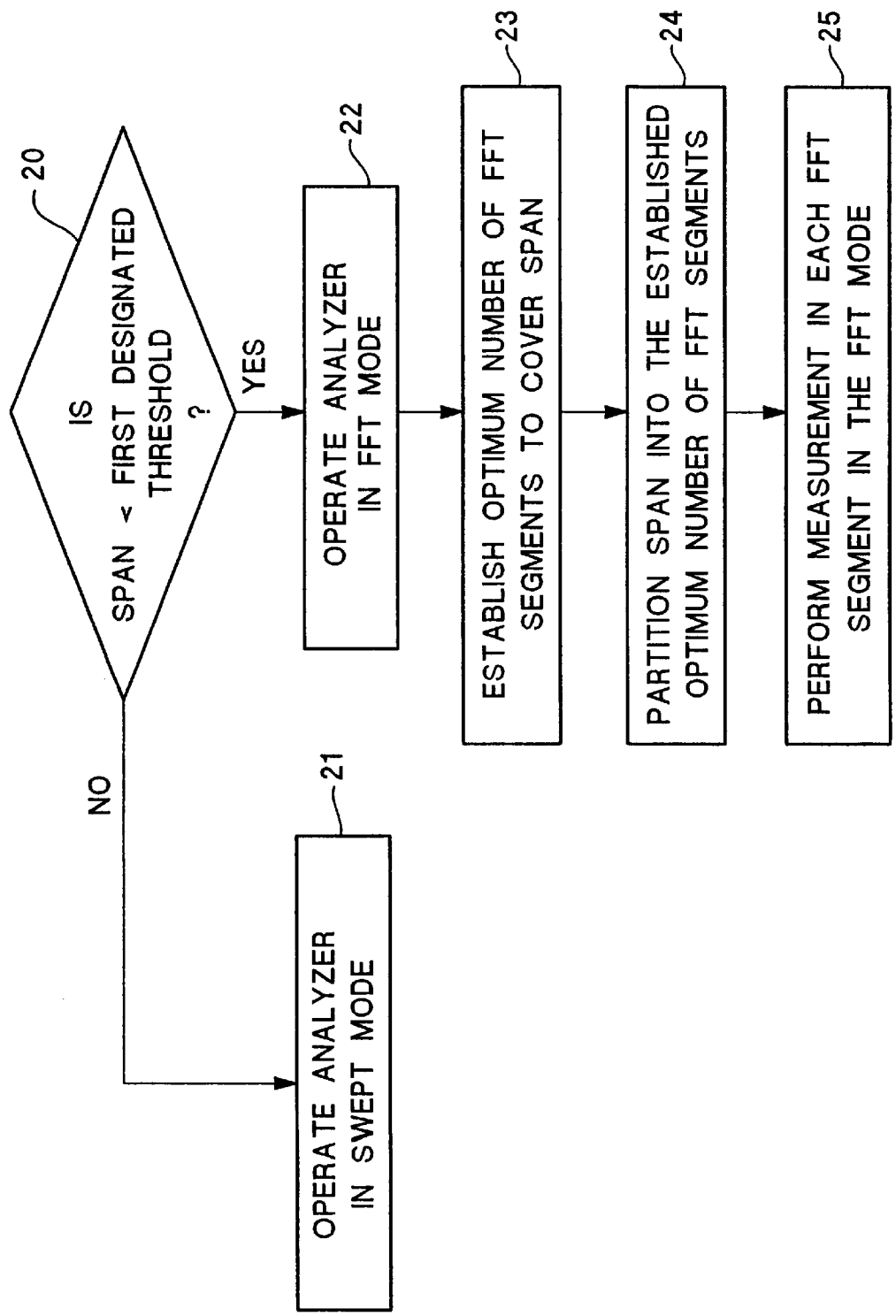
FIGS. 2A and 2B show detailed views of the flow diagram of FIG. 1.

FIG. 2A shows a detailed view of the measurement speed optimization scheme of step 15 of FIG. 1. In step 20 of FIG. 2A, either the swept operating mode or the FFT operating mode of the analyzer is automatically selected, based on whether or not the measurement frequency span (SPAN) is less than a first designated threshold. Under the condition that the measurement frequency span is not less than the first designated threshold, the analyzer is operated in the swept mode, as indicated in step 21. In the swept mode, measurements covering the measurement frequency span are performed using known swept signal analysis techniques, such as those used in the HP 8593E spectrum analyzer, available from Agilent Technologies. Under the condition that the measurement frequency span is less than the first designated threshold, the analyzer is operated in the FFT mode as indicated in step 22. Operation in the FFT mode includes steps 23–25. In step 23, the measurement frequency span is partitioned into an optimum number of FFT segments sufficient to cover the measurement frequency span. As an example, the optimum number is established according to the following relationship:

Optimum number of FFT segments=1+INT(SPAN/(5000*RBW))

where INT designates the integer portion of the quotient of SPAN/(5000*RBW) and where SPAN indicates the measurement frequency span and where RBW indicates the resolution bandwidth as received in step 11 of FIG. 1.

Once the optimum number of FFT segments is established in step 23, the frequency measurement span is partitioned into this number of FFT segments, and measurements over the measurement frequency span are performed using known FFT signal analysis techniques (such as those used in the HP 8563E spectrum analyzer available from Agilent Technologies) for each of the FFT segments in the FFT mode, as indicated in step 24 and step 25.

The first designated threshold is that measurement frequency span at which the time to measure the optimum number of frequency segments with the signal analyzer operating in the FFT operating mode is approximately equal to the total time to measure over that frequency span with the signal analyzer in the swept operating mode at the received resolution bandwidth setting. Alternatively, the first designated threshold is determined according to hardware settling times, measurement acquisition times, measurement computation times, or other performance characteristics of the signal analyzer.

Figure 2B:
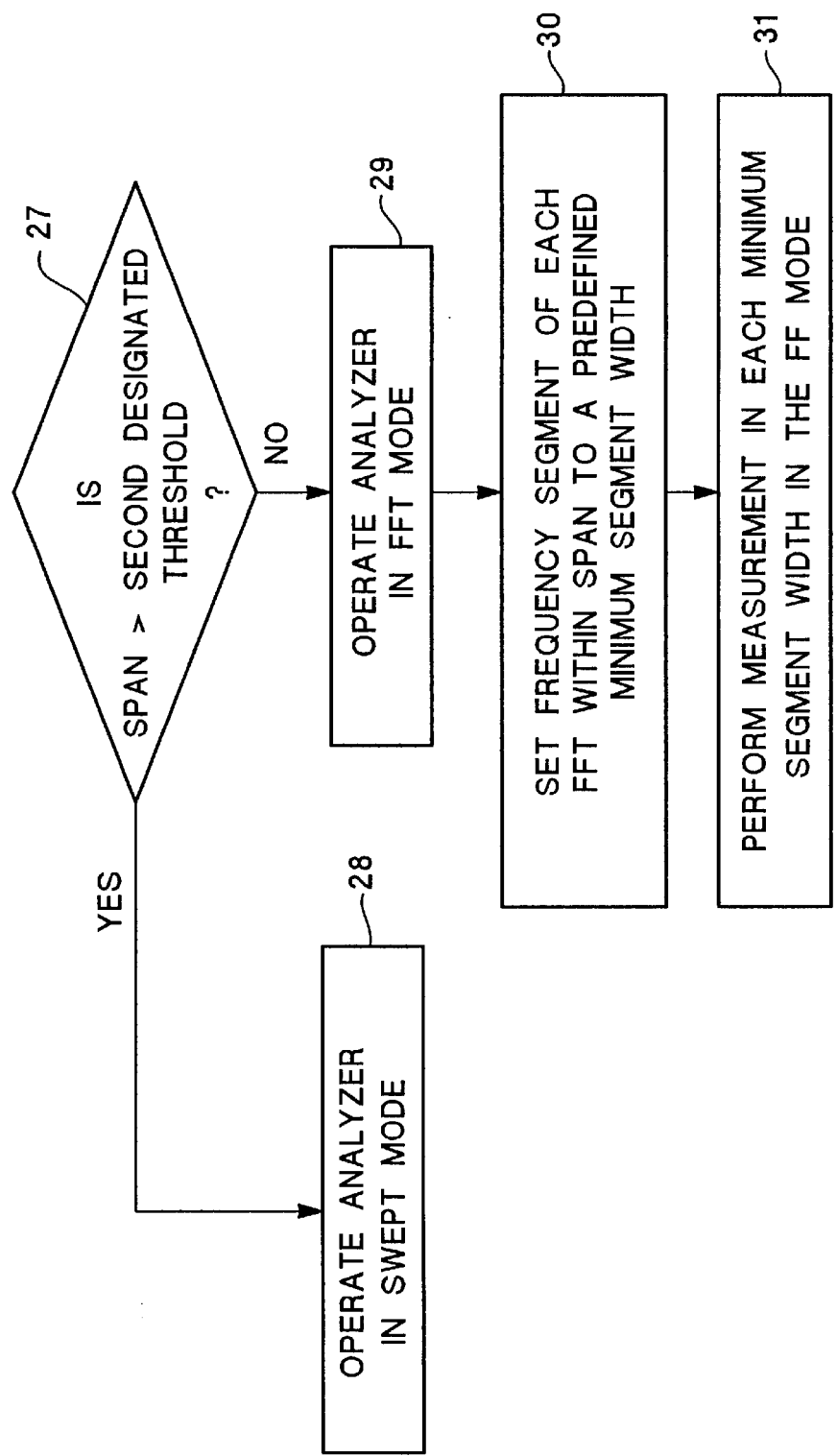

FIG. 2B shows a detailed view of the dynamic range optimization scheme of step 16 of FIG. 1. In step 27 of FIG. 2B, either the swept operating mode or the FFT operating mode of the analyzer is automatically selected, based on whether or not the measurement frequency span (SPAN) exceeds a second designated threshold. Under the condition that the measurement frequency span exceeds the second designated threshold, the analyzer is operated in the swept mode, as indicated in step 28. Under the condition that the measurement frequency span does not exceed the second designated threshold, the analyzer is operated in the FFT mode as indicated in step 29. Operation in the FFT mode includes steps 30–31. In step 30, the frequency segments of each FFT within the measurement frequency span are each set to a predefined minimum width. In this example, the predefined minimum width is 2.5 kHz and is related to the bandwiddth of a pre-filter within the signal analyzer.

Once the width of each of the FFT frequency segments is set to the predefined minimum width in step 30, the measurement frequency span is then partitioned into the number of FFT segments, each having the predefined minimum width, necessary to cover the measurement frequency span. Measurements over the measurement frequency span are performed for each of the FFT segments in the FFT mode, as indicated in step 31.

The second designated threshold is that frequency span at which the time to measure the total of the frequency segments having the minimum width with the signal analyzer in the FFT operating mode is approximately equal to the time to measure over the predefined frequency span with the signal analyzer in the swept operating mode at the received resolution bandwidth setting.

Figure 3:
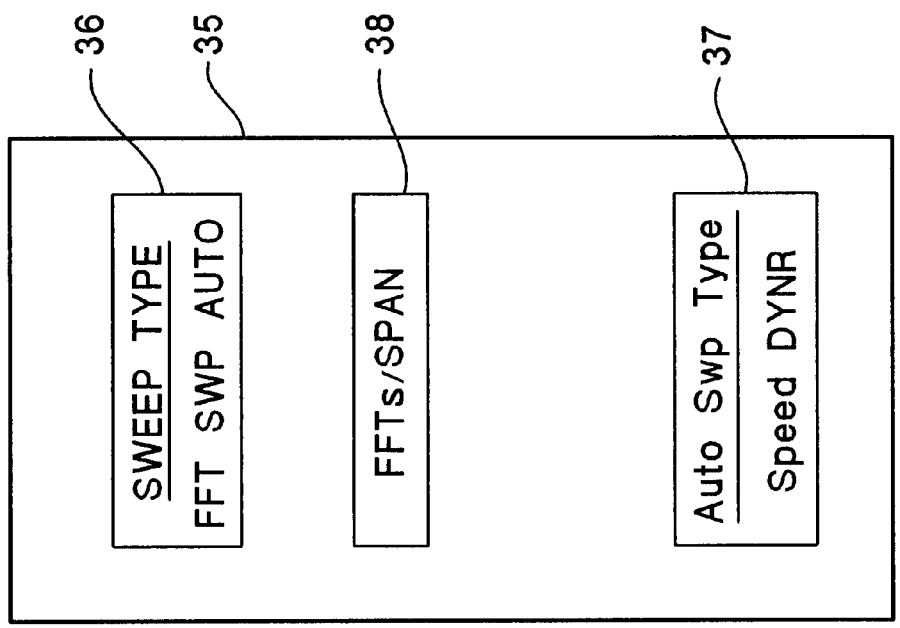
FIG. 3 is an example of a user interface for use with the mode selection method constructed according to the preferred embodiment of the present invention.

FIG. 3 shows an example of the user interface 35. The user interface 35 includes dedicated input keys on a front panel or any other input device associated with the signal analyzer. Alternatively, the user interface 35 includes softkeys within dedicated menus or within menus used to set other measurement settings of the signal analyzer, such as those providing the measurement frequency span and the resolution bandwidth setting.

A first menu selection alternative 36 within the user interface 35 provides for selection of either the manual state or the automatic state. Under the condition that the manual state is selected, the first menu selection alternative 36 then provides for selection of either the FFT operating mode or the swept operating mode. In this example, the first menu selection alternative 36 is labeled "SWEEP TYPE".Selection of the automatic state is enabled by input to the first menu selection alternative 36 of the user interface 35 to a key labeled "AUTO". Selection of the FFT operating mode, or alternatively the swept operating mode, in the manual state is enabled by input to the first menu selection alternative 36 of the user interface 35 to a key labeled "FFT", or alternatively to a key labeled "SWP", respectively. Under the condition that the FFT operating mode is selected in the manual state via input to the first menu selection alternative, the number of FFT segments within the measurement frequency span is selectable using an optionally included key 38 labeled "FFTs/SPAN" within the user interface 35. In the manual state, the first menu selection alternative 36 enables selection of the alternative swept and FFT operating modes independent of other measurement settings of the signal analyzer, such as the measurement frequency span and the resolution bandwidth setting.

A second menu selection alternative 37 within the user interface 35 is operative under the condition that the automatic state is enabled by input to the key labeled "AUTO" of the first menu alternative 36 of the user interface 35. In this example, the second menu selection alternative 37 is labeled "AUTO SWP TYPE". The second menu selection alternative 37 provides for selection of either measurement speed optimization or dynamic range optimization. Selection of the measurement speed optimization is enabled by input to the second menu selection alternative 37 of the user interface 35 to a key labeled "SPEED". Selection of the dynamic range optimization is enabled by input to the second menu selection alternative 37 of the user interface 35 to a key labeled "DYNR".

In alternative preferred embodiments of the present invention, the measurement speed optimization as shown in FIG. 2A, and dynamic range optimization as shown in FIG. 2B, are independently operable for use in a signal analyzer having alternative swept and FFT operating modes.

While the preferred embodiments of the present invention have been illustrated in detail, it should be apparent that modifications and adaptations to these embodiments may occur to one skilled in the art without departing from the scope of the present invention as set forth in the following claims.

What is claimed is:

1. A method for selecting between alternative operating modes of a signal analyzer, comprising:
   setting the signal analyzer to one of a manual state and an automatic state according to a first input to a user interface;
   setting the signal analyzer to one of a swept operating mode and a Fast Fourier Transform (FFT) operating mode according to a second input to the user interface under condition that the manual state is set; and
   performing one of a measurement speed optimization and a dynamic range optimization based on received measurement settings of the signal analyzer including at least one of a measurement frequency span and a resolution bandwidth setting, according to a third input to a user interface under condition that the automatic state is set, wherein performing the measurement speed optimization includes establishing an optimum number of frequency segments to cover the measurement frequency span, partitioning the measurement frequency span into the optimum number of frequency segments and measuring each of the frequency segments with the signal analyzer operating in the FFT operating mode under condition that the measurement frequency span is less than a first designated threshold, and under condition that the measurement frequency span is not less than the first designated threshold measuring over the measurement frequency span with the signal analyzer in the swept operating mode at the received resolution bandwidth setting.

2. The method of claim 1 wherein the optimum number of frequency segments is one plus the integer portion of the quotient of the frequency span and five thousand times the resolution bandwidth setting.

3. The method of claim 1 wherein the first designated threshold is a predetermined frequency span at which time to measure the optimum number of frequency segments within the predetermined frequency span with the signal analyzer operating in the FFT operating mode is approximately equal to time to measure over the predetermined frequency span with the signal analyzer in the swept operating mode at the received resolution bandwidth setting.

4. The method of claim 3 wherein the second designated threshold is a predefined frequency span at which time to measure the total of the frequency segments having the minimum width with the signal analyzer in the FFT operating mode is approximately equal to time to measure over the predefined frequency span with the signal analyzer in the swept operating mode at the received resolution bandwidth setting.

5. The method of claim 4 wherein the user interface includes a first menu selection alternative receiving the first input and the second input, the first menu selection alternative including a first choice corresponding to selection of the automatic state and a second choice corresponding to selection between the swept operating mode and the FFT operating mode of the manual state and a second menu selection alternative receiving the third input corresponding to selection between the measurement speed optimization and the dynamic range optimization of the automatic state.

6. The method of claim 1 wherein performing the dynamic range optimization includes measuring over the measurement frequency span with the signal analyzer in the swept operating mode at the received resolution bandwidth setting under condition that the frequency span exceeds a second designated threshold, and under condition that the frequency span does not exceed the second designated threshold, partitioning the frequency span into multiple frequency segments each having a designated minimum width and measuring each of the frequency segments having the designated minimum width with the signal analyzer in the FFT operating mode.

7. The method of claim 6 wherein the second designated threshold is a predefined frequency span at which time to measure the total of the frequency segments having the minimum width with the signal analyzer in the FFT operating mode is approximately equal to time to measure over the predefined frequency span with the signal analyzer in the swept operating mode at the received resolution bandwidth setting.

8. The method of claim 1 wherein the user interface includes a first menu selection alternative receiving the first input and the second input, the first menu selection alternative including a first choice corresponding to selection of the automatic state and a second choice corresponding to selection between the swept operating mode and the FFT operating mode of the manual state and a second menu selection alternative receiving the third input corresponding to selection between the measurement speed optimization and the dynamic range optimization of the automatic state.

9. A measurement speed optimization method for a signal analyzer having alternative operating modes, comprising:

establishing an optimum number of frequency segments to cover a measurement frequency span, partitioning the measurement frequency span into the optimum number of frequency segments, and measuring each of the frequency segments with the signal analyzer operating in a Fast Fourier Transform (FFT) operating mode, under condition that the measurement frequency span is less than a designated threshold; and under condition that the measurement frequency span is not less than the designated threshold, measuring over the measurement frequency span with the signal analyzer in a swept operating mode, wherein the designated threshold is a predetermined frequency span at which time to measure the optimum number of frequency segments within the predetermined frequency span with the signal analyzer operating in the FFT operating mode is approximately equal to time to measure over the predetermined frequency span with the signal analyzer in the swept operating mode.

10. A dynamic range optimization method for a signal analyzer having alternative operating modes, comprising:

measuring over a measurement frequency span with the signal analyzer in a swept operating mode under condition that the measurement frequency span exceeds a designated threshold; and under condition that the measurement frequency span does not exceed the second designated threshold, partitioning the frequency span into multiple frequency segments each having a designated minimum width and measuring each of the frequency segments having the designated minimum width with the signal analyzer in a Fast Fourier Transform (FFT) operating mode, wherein the designated threshold is a predefined frequency span at which time to measure the total of the frequency segments having the minimum width with the signal analyzer in the FFT operating mode is approximately equal to time to measure over the predefined frequency span with the signal analyzer in the swept operating mode.

* * * * *